(12) United States Patent
Ankney et al.

(10) Patent No.: US 11,388,812 B1
(45) Date of Patent: Jul. 12, 2022

(54) THERMAL ACTIVE HEAT SINK

(71) Applicant: Hamilton Sundstrand Corporation, Charlotte, NC (US)

(72) Inventors: Darrell E. Ankney, Dixon, IL (US); Nicholas Wlaznik, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/130,950

(22) Filed: Dec. 22, 2020

(51) Int. Cl.
*H05K 1/02* (2006.01)
*H05K 7/20* (2006.01)
*H01L 23/373* (2006.01)

(52) U.S. Cl.
CPC ......... *H05K 1/0209* (2013.01); *H05K 1/0207* (2013.01); *H01L 23/3736* (2013.01); *H05K 7/20509* (2013.01); *H05K 2201/066* (2013.01)

(58) Field of Classification Search
CPC ............... H05K 7/2039; H05K 7/2049; H05K 7/20136; H05K 7/20909; H05K 1/0203; H05K 1/0209; H05K 2201/066; H05K 2201/10598; H01L 23/367; H01L 23/40; H01L 23/4093; H01L 23/4087; H01L 23/4338; H01L 2023/4037; H01L 2023/405; H01L 2023/4075–4087
See application file for complete search history.

(56) References Cited

U.S. PATENT DOCUMENTS

| | | | |
|---|---|---|---|
| 6,278,607 B1 * | 8/2001 | Moore | G06F 1/203 361/679.54 |
| 8,736,049 B1 * | 5/2014 | Cheng | H01L 23/467 257/713 |
| 9,970,208 B2 | 5/2018 | Irons | |
| 9,982,661 B1 * | 5/2018 | Trigwell | H05K 7/20 |
| 2008/0192430 A1 * | 8/2008 | Brandenburg | H01L 23/467 361/695 |
| 2009/0237887 A1 * | 9/2009 | Shibata | H05K 7/20445 361/709 |

(Continued)

FOREIGN PATENT DOCUMENTS

| | | |
|---|---|---|
| CN | 108649838 A | 12/2018 |
| CN | 111425366 A | 7/2020 |

(Continued)

OTHER PUBLICATIONS

English Translation of JP-06163757-A (Year: 1994).*

*Primary Examiner* — Zachary Pape
*Assistant Examiner* — Amir A Jalali
(74) *Attorney, Agent, or Firm* — Cantor Colburn LLP

(57) ABSTRACT

An electronic controller is provided and includes a printed wiring board (PWB) on which electronics are operably disposed, a power supply configured to supply power to the electronics, a heat sink and one or more thermal conductors anchored to the PWB to assume and move between first and second connection states in first and second thermal conditions, respectively. The first connection states are characterized in that the one or more thermal conductors are thermally attached to the PWB and the power supply and thermally disconnected from the heat sink. The second connection states are characterized in that the one or more thermal conductors are thermally attached to the PWB and the power supply and to the heat sink.

10 Claims, 1 Drawing Sheet

(56) References Cited

U.S. PATENT DOCUMENTS

| | | | |
|---|---|---|---|
| 2010/0089468 A1* | 4/2010 | Scott | F01D 17/14 |
| | | | 137/468 |
| 2013/0021768 A1* | 1/2013 | Kim | H01L 23/3736 |
| | | | 361/783 |
| 2014/0204532 A1* | 7/2014 | Mehring | H05K 7/20345 |
| | | | 361/689 |
| 2015/0079667 A1* | 3/2015 | Brahmasandra | B01L 7/52 |
| | | | 435/287.2 |
| 2017/0074256 A1* | 3/2017 | Banko | F03G 6/00 |
| 2019/0014680 A1* | 1/2019 | Valle | H05K 5/0204 |
| 2019/0019641 A1* | 1/2019 | Signer | H01H 85/36 |
| 2019/0310024 A1 | 10/2019 | Townsend et al. | |
| 2020/0075926 A1* | 3/2020 | Torok | H01M 10/4257 |
| 2020/0229318 A1* | 7/2020 | Grau | H05K 7/2049 |
| 2021/0112315 A1* | 4/2021 | Mays | H04Q 1/035 |

FOREIGN PATENT DOCUMENTS

| | | | |
|---|---|---|---|
| CN | 111509117 A | | 8/2020 |
| JP | 06163758 A | * | 6/1994 |

* cited by examiner

THERMAL ACTIVE HEAT SINK

BACKGROUND

The present disclosure relates to aircrafts and, in particular, to a thermal active heat sink for use in electronic controllers of aircrafts where operating temperatures vary widely.

Aircraft operating temperatures can vary widely from extremely cold temperatures around −55° C. to extremely hot temperatures around +85° C. These temperature ranges affect various components of aircrafts including, but not limited to, electronic controllers. In the case of electronic controllers, in particular, exposure to the temperature ranges can lead to issues with power supplies being reliable. The power supplies can be internal to electronic controllers and the electronic controllers may not always power up at least at the extreme cold temperature ranges. Even if power supplies are left on to warm up the electronic controllers, the heat sink that is usually attached to the electronic controllers tends to pull the heat out of the power supply at the extreme cold temperature ranges.

BRIEF DESCRIPTION

According to an aspect of the disclosure, an electronic controller is provided and includes a printed wiring board (PWB) on which electronics are operably disposed, a power supply configured to supply power to the electronics, a heat sink and one or more thermal conductors anchored to the PWB to assume and move between first and second connection states in first and second thermal conditions, respectively. The first connection states are characterized in that the one or more thermal conductors are thermally attached to the PWB and the power supply and thermally disconnected from the heat sink. The second connection states are characterized in that the one or more thermal conductors are thermally attached to the PWB and the power supply and to the heat sink.

In accordance with additional or alternative embodiment, the first thermal conditions are relatively cold temperature conditions and the second thermal conditions are relatively hot temperature conditions.

In accordance with additional or alternative embodiment, insulating material is supportive of the PWB and the power supply relative to the heat sink.

In accordance with additional or alternative embodiment, the PWB includes a copper plane to which the one or more thermal conductors are respectively anchored.

In accordance with additional or alternative embodiment, the one or more thermal conductors are anchored to at least a periphery of the PWB as an array of peripheral thermal conductors.

In accordance with additional or alternative embodiment, the electronic controller further includes an external heat sink on which the heat sink is disposed.

In accordance with additional or alternative embodiment, the one or more thermal conductors includes bimetal laminates and the bimetal laminates includes steel and copper layers.

In accordance with additional or alternative embodiment, the one or more thermal conductors includes at least one of bimetal coils and bimetal strips.

According to an aspect of the disclosure, an electronic controller is provided and includes a printed wiring board (PWB) on which electronics are operably disposed, a power supply configured to supply power to the electronics, a heat sink and bimetal coils anchored to the PWB to contract and extend in relatively cold and relatively hot conditions, respectively. Contractions of the bimetal coils are characterized in that the bimetal coils are thermally attached to the PWB and the power supply and thermally disconnected from the heat sink. Extensions of the bimetal coils are characterized in that the bimetal coils are thermally attached to the PWB and the power supply and to the heat sink.

In accordance with additional or alternative embodiment, insulating material is supportive of the PWB and the power supply relative to the heat sink.

In accordance with additional or alternative embodiment, the PWB includes a copper plane to which the bimetal coils are respectively anchored.

In accordance with additional or alternative embodiment, the bimetal coils are anchored to at least a periphery of the PWB as an array of peripheral bimetal coils.

In accordance with additional or alternative embodiment, the electronic controller further includes an external heat sink on which the heat sink is disposed.

In accordance with additional or alternative embodiment, the bimetal coils includes laminated steel and copper layers.

According to an aspect of the disclosure, an electronic controller is provided and includes a printed wiring board (PWB) on which electronics are operably disposed, a power supply configured to supply power to the electronics, a heat sink and bimetal strips anchored to the PWB to straighten and bend in relatively cold and relatively hot conditions, respectively. Straightenings of the bimetal strips are characterized in that the bimetal strips are thermally attached to the PWB and the power supply and thermally disconnected from the heat sink. Bends of the bimetal strips are characterized in that the bimetal strips are thermally attached to the PWB and the power supply and to the heat sink.

In accordance with additional or alternative embodiment, insulating material is supportive of the PWB and the power supply relative to the heat sink.

In accordance with additional or alternative embodiment, the PWB includes a copper plane to which the bimetal strips are respectively anchored.

In accordance with additional or alternative embodiment, the bimetal strips are anchored to at least a periphery of the PWB as an array of peripheral bimetal strips.

In accordance with additional or alternative embodiment, the electronic controller includes an external heat sink on which the heat sink is disposed.

In accordance with additional or alternative embodiment, the bimetal strips includes laminated steel and copper layers.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, an electronic controller is provided for use in various applications including, but not limited to, an aircraft. The electronic controller has an active power supply heat sink that allows the power supply to separate from the heat sink thus warming up to an appropriate operating temperature whereupon the power supply and heat sink reconnect to keep the power supply from over-heating. The active power supply heat sink can include a temperature sensitive material that contracts when cold and expands when hot to keep the power supply at a normal operating temperature range. The temperature sensitive material can be included in a bimetal strip of steal and copper that can be coiled or left as a strip. As the temperature of the coil or strip increases the coil or strip expands and makes a thermal connection between a power supply base and the heatsink.

Figure 1:
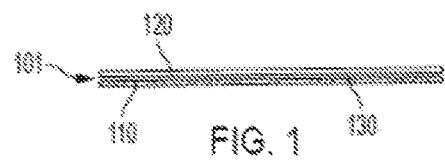
FIG. 1 is a side view of a strip with a bimetal laminate for use in an electronic controller without heat being applied thereto in accordance with embodiments.
Figure 2:
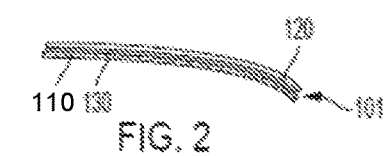
FIG. 2 is a side view of a strip with a bimetal laminate for use in an electronic controller with heat being applied thereto in accordance with embodiments.

With reference to FIGS. 1 and 2, a thermal conductor 101 is provided as a bimetal laminate. The thermal conductor 101 has first and second layers 110 and 120 that are joined by adhesive 130 for example. The first and second layers 110 and 120 can be metal layers that have different coefficients of thermal expansion (CTEs). As such, when the thermal conductor 101 is exposed to relatively cold ambient temperatures, the thermal conductor 101 is straight as shown in FIG. 1 and, when the thermal conductor 101 is exposed to relatively hot ambient temperatures, the thermal conductor 101 is curved or bent. In accordance with embodiments, the first layer 110 can be steel or another similar metallic material and the second layer 120 can be copper or another similar metallic material.

Figure 3:
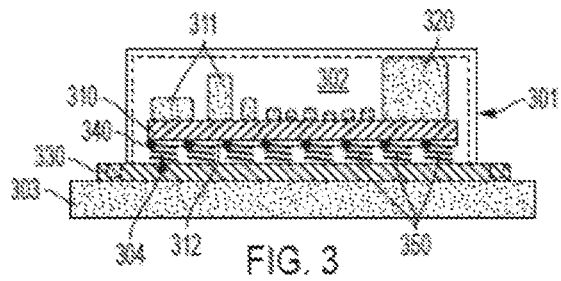
FIG. 3 is a side schematic view of an electronic controller with an active power supply heat sink having a bimetal coil in relatively cold conditions in accordance with embodiments.
Figure 4:
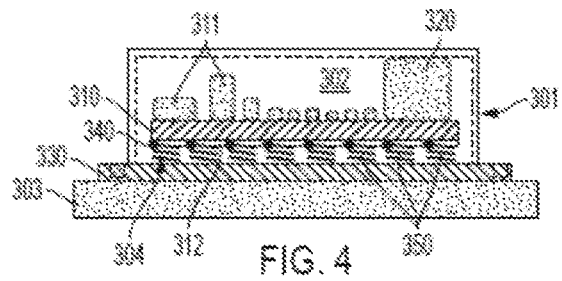
FIG. 4 is a side schematic view of an electronic controller with an active power supply heat sink having a bimetal coil in relatively hot conditions in accordance with embodiments.
Figure 5:
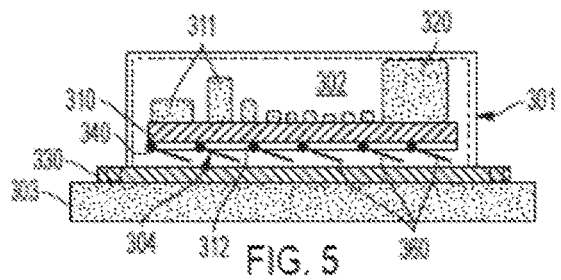
FIG. 5 is a side schematic view of an electronic controller with an active power supply heat sink having a bimetal strip in relatively cold conditions in accordance with embodiments.
Figure 6:
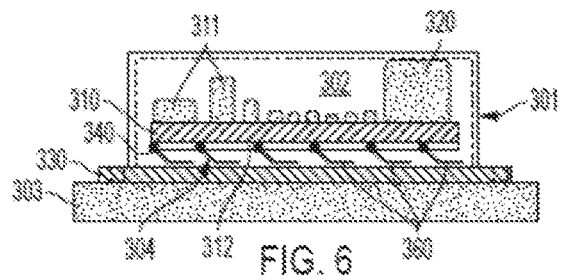
FIG. 6 is a side schematic view of an electronic controller with an active power supply heat sink having a bimetal strip in relatively hot conditions in accordance with embodiments.

With reference to FIGS. 3 and 4 and with reference to FIGS. 5 and 6, an electronic controller 301 is provided for use in an aircraft or other similar applications. The electronic controller 301 includes a printed wiring board (PWB) 310 on which electronics 311 are operably disposed, a power supply 320 that is configured to supply power to the electronics 311 and a heat sink 330. The electronic controller 301 can also include one or more thermal conductors 340 that are each anchored to the PWB 310 to assume and move between first and second connection states in first (e.g., relatively cold) and second (e.g., relatively hot) thermal conditions, respectively. The first connection states are characterized in that the one or more thermal conductors 340 are thermally attached to the PWB 310 and the power supply 320 and thermally disconnected from the heat sink 330. The second connection states are characterized in that the one or more thermal conductors 340 are thermally attached to the PWB 310 and the power supply 320 and to the heat sink 330.

In accordance with embodiments, the electronic controller 301 can also include insulating material 302 that is supportive of the PWB 310 and the power supply 320 relative to the heat sink 330 and an external heat sink 303 and the PWB 310 can include a copper plane 312. The heat sink 330 can be disposed on the external heat sink 303. The one or more thermal conductors 340 can be respectively anchored on the copper plane 312. In some cases, the one or more thermal conductors 340 can be anchored to at least a periphery of the copper plane 312 of the PWB 310 as an array of peripheral thermal conductors 304.

The following descriptions relate to further embodiments and, unless otherwise noted, will incorporate the details of the electronic controller 301 described above.

In accordance with embodiments and, as shown in FIGS. 3 and 4, the one or more thermal conductors 340 can include or be provided as bimetal coils 350. In these or other cases, the bimetal coils 350 are configured similarly as the bimetal laminates of the thermal conductor 101 of FIGS. 1 and 2. In any case, the bimetal coils 350 are anchored to the PWB 310 and are configured to contract and extend in relatively cold and relatively hot conditions, respectively. Contractions of the bimetal coils 350 in the relatively cold conditions (see FIG. 3) are characterized in that the bimetal coils 350 are thermally attached to the PWB 310 and the power supply 320 and in that the bimetal coils 350 are thermally disconnected from the heat sink 330. Conversely, extensions of the bimetal coils 350 in the relatively hot conditions (see FIG. 4) are characterized in that the bimetal coils 350 are thermally attached to the PWB 310 and the power supply 320 and in that the bimetal coils are thermally attached to the heat sink 330 as well.

In this way, a power up of the power supply 320 and the electronics 311 can be conducted in the relatively cold conditions, such as when an aircraft operates in relatively cold conditions at around −55° C., without thermal energy being inefficiently lost via the heat sink 330 since the bimetal coils 350 are contracted and thermally disconnected from the heat sink 330. As temperatures increase and the bimetal coils 350 extend to become thermally attached to the heat sink 330, such as when the aircraft operates in relatively hot conditions at around +85° C., thermal energy can be dissipated from the power supply 320 and the electronics 311 via the heat sink 330 so as to avoid overheated conditions.

In accordance with embodiments and, as shown in FIGS. 5 and 6, the one or more thermal conductors 340 can include or be provided as bimetal strips 360. In these or other cases, the bimetal strips 360 are configured similarly as the bimetal laminates of the thermal conductor 101 of FIGS. 1 and 2. In any case, the bimetal strips 360 are anchored to the PWB 310 and configured to straighten and bend in relatively cold and relatively hot conditions, respectively. Straightenings of the bimetal strips 360 in the relatively cold conditions (see FIG. 5) are characterized in that the bimetal strips 360 are thermally attached to the PWB 310 and the power supply 320 and in that the bimetal strips 360 are thermally disconnected from the heat sink 330. Conversely, bendings of the bimetal strips 360 in the relatively hot conditions (see FIG. 6) are characterized in that the bimetal strips 360 are thermally attached to the PWB 310 and the power supply 320 and in that the bimetal strips 360 are thermally attached to the heat sink 330 as well.

In this way, a power up of the power supply 320 and the electronics 311 can be conducted in the relatively cold conditions, such as when an aircraft operates in relatively cold conditions at around −55° C., without thermal energy being inefficiently lost via the heat sink 330 since the bimetal strips 360 are straightened and thermally disconnected from the heat sink 330. As temperatures increase and the bimetal strips 360 extend to become thermally attached to the heat sink 330, such as when the aircraft operates in relatively hot conditions at around +85° C., thermal energy can be dissipated from the power supply 320 and the electronics 311 via the heat sink 330 so as to avoid overheated conditions.

Although the one or more thermal conductors 340, the bimetal coils 350 and the bimetal strips 360 are generally described as bimetal laminates, it is to be understood that this is not required and that other embodiments are encompassed within the present description and the claims. These other embodiments include, but are not limited to, cases in which the one or more thermal conductors 340 include smart metal components and phase change materials (PCM) that are responsive to applied voltages and the like. That is, where the one or more thermal conductors 340 include smart materials or PCM, the one or more thermal conductors 340 can assume the first connection states with no voltage applied in the relatively cold temperatures and the second connection states with voltage applied in the relatively hot temperatures. Still other embodiments include, but are not limited to, cases in which the one or more thermal conductors 340 are operated by electro-mechanical elements that electro-mechanically force the one or more thermal conductors 340 to assume the first connection states with no voltage applied in the relatively cold temperatures and the second connection states with voltage applied in the relatively hot temperatures.

Technical effects and benefits of the present disclosure are the provision of an electronic controller that allows internal power supplies to operate below normal operating temperatures and prevent electronic controller start-up issues at cold temperatures. This in turn allows the electronic controller to be mounted in colder environments on the aircraft.

The corresponding structures, materials, acts, and equivalents of all means or step-plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. An electronic controller, comprising:
   a printed wiring board (PWB) on which electronics are operably disposed and comprising a copper plane at a lower portion thereof to form a lowermost plane of the PWB;
   a power supply configured to supply power to the electronics;
   a heat sink;
   insulating material supportive of the PWB and the power supply over the heat sink; and
   one or more thermal conductors directly anchored to exterior facing surfaces of the copper plane at the lower portion of the PWB at a periphery of the PWB to form an array of peripheral thermal conductors in and below the lowermost plane of the PWB and to assume and move between a first connection state in cold temperature conditions and a second connection state in hot temperature conditions,
   the first connection states being characterized in that the one or more thermal conductors are thermally attached to the PWB and the power supply and thermally disconnected from the heat sink, and
   the second connection states being characterized in that the one or more thermal conductors are thermally attached to the PWB and the power supply and to the heat sink.

2. The electronic controller according to claim 1, further comprising an external heat sink on which the heat sink is disposed.

3. The electronic controller according to claim 1, wherein the one or more thermal conductors comprise bimetal laminates and the bimetal laminates comprise steel and copper layers.

4. The electronic controller according to claim 1, wherein the one or more thermal conductors comprise at least one of bimetal coils and bimetal strips.

5. An electronic controller, comprising:
   a printed wiring board (PWB) on which electronics are operably disposed and comprising a copper plane at a lower portion thereof to form a lowermost plane of the PWB;
   a power supply configured to supply power to the electronics;
   a heat sink;
   insulating material supportive of the PWB and the power supply over the heat sink; and
   bimetal coils directly anchored to exterior facing surfaces of the copper plane at the lower portion of the PWB at a periphery of the PWB to form an array of peripheral bimetal coils in and below the lowermost plane of the PWB and to contract and extend in relatively cold and relatively hot conditions, respectively,
   contractions of the bimetal coils being characterized in that the bimetal coils are thermally attached to the PWB and the power supply and thermally disconnected from the heat sink, and
   extensions of the bimetal coils being characterized in that the bimetal coils are thermally attached to the PWB and the power supply and to the heat sink.

6. The electronic controller according to claim 5, further comprising an external heat sink on which the heat sink is disposed.

7. The electronic controller according to claim 5, wherein the bimetal coils comprise laminated steel and copper layers.

8. An electronic controller, comprising:
   a printed wiring board (PWB) on which electronics are operably disposed and comprising a copper plane at a lower portion thereof to form a lowermost plane of the PWB;

a power supply configured to supply power to the electronics;

a heat sink;

insulating material supportive of the PWB and the power supply over the heat sink; and bimetal strips directly anchored to exterior facing surfaces of the copper plane at the lower portion of the PWB at a periphery of the PWB to form an array of peripheral bimetal strips in and below the lowermost plane of the PWB and to straighten and bend in relatively cold and relatively hot conditions, respectively, straightenings of the bimetal strips being characterized in that the bimetal strips are thermally attached to the PWB and the power supply and thermally disconnected from the heat sink, and bends of the bimetal strips being characterized in that the bimetal strips are thermally attached to the PWB and the power supply and to the heat sink.

9. The electronic controller according to claim 8, further comprising an external heat sink on which the heat sink is disposed.

10. The electronic controller according to claim 8, wherein the bimetal strips comprise laminated steel and copper layers.

\* \* \* \* \*